US010056132B1

(12) United States Patent
Lammers et al.

(10) Patent No.: US 10,056,132 B1
(45) Date of Patent: Aug. 21, 2018

(54) ASSIGNABLE REGISTERS ON A PREAMP CHIP

(71) Applicant: Seagate Technology LLC, Cupertino, CA (US)

(72) Inventors: Todd Michael Lammers, Lafayette, CO (US); Robert Matousek, Berthoud, CO (US)

(73) Assignee: Seagate Technology LLC, Cupertino, CA (US)

( * ) Notice: Subject to any disclaimer, the term of this patent is extended or adjusted under 35 U.S.C. 154(b) by 235 days.

(21) Appl. No.: 15/045,207

(22) Filed: Feb. 16, 2016

(51) Int. Cl.
*G06F 5/16* (2006.01)
*G11C 11/4096* (2006.01)
*G11C 11/4076* (2006.01)
*G11B 5/02* (2006.01)
*G06F 5/06* (2006.01)
*G06F 13/42* (2006.01)

(52) U.S. Cl.
CPC .......... *G11C 11/4096* (2013.01); *G06F 5/065* (2013.01); *G06F 13/4282* (2013.01); *G11B 5/02* (2013.01); *G11C 11/4076* (2013.01); G06F 2205/067 (2013.01)

(58) Field of Classification Search
CPC . G11C 11/4096; G11C 11/4076; G06F 5/065; G06F 13/4282; G11B 5/02
USPC .......................................................... 710/56
See application file for complete search history.

(56) References Cited

U.S. PATENT DOCUMENTS

| 3,646,334 | A | * | 2/1972 | Wold | G06G 7/1928 |
| | | | | | 708/422 |
| 3,806,814 | A | * | 4/1974 | Forbes | H04N 7/173 |
| | | | | | 725/119 |
| 4,209,843 | A | * | 6/1980 | Hyatt | B60R 16/0373 |
| | | | | | 708/422 |
| 4,542,986 | A | | 9/1985 | Berdanier | |
| 4,561,775 | A | | 12/1985 | Patrick | |
| 4,569,591 | A | | 2/1986 | Ford | |
| 4,733,961 | A | | 3/1988 | Mooney | |
| 4,803,497 | A | | 2/1989 | Kennedy, Jr. | |
| 4,942,593 | A | * | 7/1990 | Whiteside | H04J 3/0626 |
| | | | | | 327/100 |
| 5,041,924 | A | * | 8/1991 | Blackborow | G06F 1/18 |
| | | | | | 360/137 |
| 5,093,660 | A | | 3/1992 | Beauducel | |
| 5,218,630 | A | | 6/1993 | Patsiokas | |
| 5,235,575 | A | | 8/1993 | Han | |
| 5,428,649 | A | * | 6/1995 | Cecchi | H04J 3/0626 |
| | | | | | 370/505 |
| 5,535,412 | A | * | 7/1996 | Nadehara | G06F 9/3552 |
| | | | | | 711/110 |

(Continued)

*Primary Examiner* — Paul R Myers
(74) *Attorney, Agent, or Firm* — Cesari & Reed, LLP; Kirk A. Cesari; Christian W. Best

(57) ABSTRACT

Amplifiers, preamplifiers, and other circuits may have registers that are assigned to store data corresponding to certain functions. When the data stored in the registers are no longer needed, the registers may be assigned to store data corresponding to other functions, such as signal acquisition. The registers can be logically grouped into a virtual memory bank. The memory bank may store new data to a first register, and move data from the first register to a second register when new data arrives. In some embodiments, these registers and memory control circuit can be implemented within a preamplifier circuit.

22 Claims, 10 Drawing Sheets

(56) References Cited

U.S. PATENT DOCUMENTS

| | | | |
|---|---|---|---|
| 5,568,464 A | 10/1996 | Horle | |
| 5,668,470 A | 9/1997 | Shelor | |
| 5,726,821 A | 3/1998 | Cloke et al. | |
| 5,768,624 A * | 6/1998 | Ghosh | G06F 13/1673 710/53 |
| 5,857,980 A * | 1/1999 | Wilson | A61B 5/04884 600/546 |
| 6,072,761 A | 6/2000 | Tani | |
| 6,122,127 A | 9/2000 | Flinsbaugh | |
| 6,268,820 B1 * | 7/2001 | Sherry | G06F 3/05 341/139 |
| 6,288,863 B1 | 9/2001 | Flinsbaugh | |
| 6,301,299 B1 * | 10/2001 | Sita | G09G 5/39 348/714 |
| 6,532,391 B1 | 3/2003 | Nayler | |
| 6,904,475 B1 | 6/2005 | Fairman | |
| 7,133,600 B1 * | 11/2006 | Boyle | G11B 20/18 360/49 |
| 7,221,305 B2 | 5/2007 | Kim | |
| 7,623,152 B1 * | 11/2009 | Kaplinsky | G06T 7/254 348/155 |
| 7,787,206 B2 | 8/2010 | Yen | |
| 7,881,000 B2 | 2/2011 | Lee | |
| 8,441,909 B1 | 5/2013 | Thayamballi | |
| 8,711,502 B1 | 4/2014 | Wilson et al. | |
| 8,756,361 B1 * | 6/2014 | Carlson | G11B 20/10527 711/200 |
| 9,829,581 B2 * | 11/2017 | Singh | G01S 19/28 |
| 2002/0041401 A1 * | 4/2002 | Keng | H04N 1/40 358/443 |
| 2002/0176156 A1 | 11/2002 | Zahnley | |
| 2003/0185260 A1 | 10/2003 | Seo | |
| 2005/0276178 A1 | 12/2005 | Nishimura | |
| 2006/0083136 A1 | 4/2006 | Lee | |
| 2007/0096013 A1 | 5/2007 | Sugimoto | |
| 2008/0188752 A1 * | 8/2008 | Randall | A61B 8/06 600/455 |
| 2009/0245302 A1 * | 10/2009 | Baird | H01S 3/102 372/25 |
| 2010/0183298 A1 * | 7/2010 | Biegert | H04Q 11/0067 398/17 |
| 2016/0218732 A1 * | 7/2016 | Kim | H03M 1/124 |

* cited by examiner

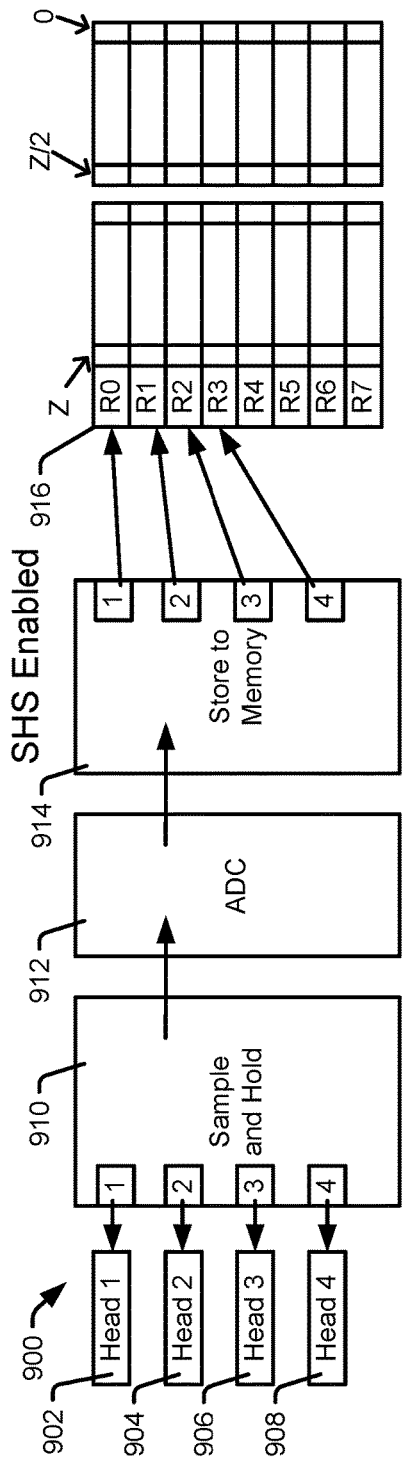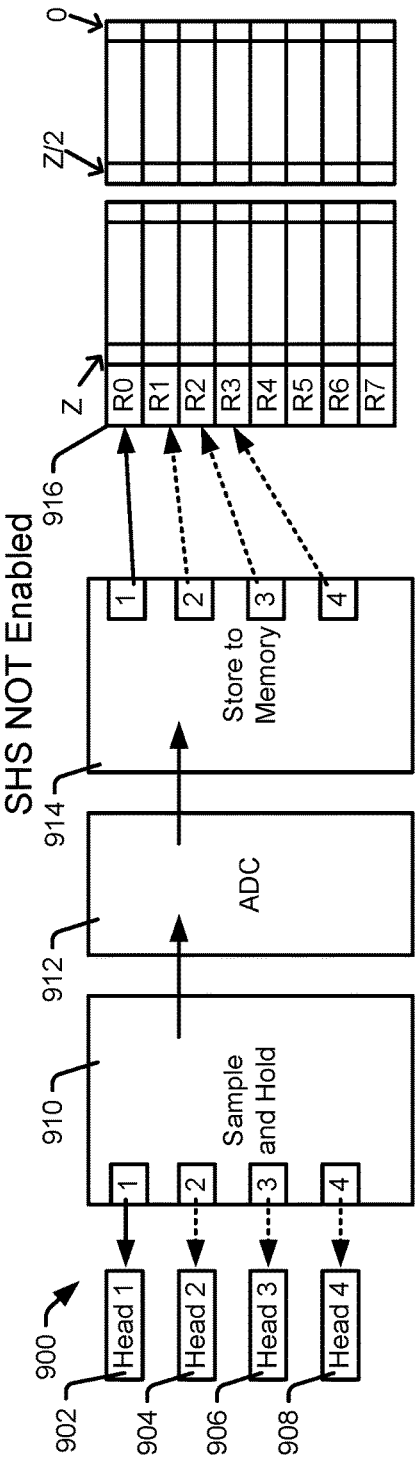

ASSIGNABLE REGISTERS ON A PREAMP CHIP

SUMMARY

In some embodiments, a preamplifier can include a plurality of memory registers, a first input to receive an analog signal, a data converter circuit to convert the analog signal into digital values, and an interface configured to receive programmable settings from a controller circuit to selectively program a set of memory registers of the plurality of memory registers to store the digital values.

In some embodiments, a preamplifier can include a plurality of memory registers, a first input to receive an analog signal, a data converter circuit to convert the analog signal into digital values, and an interface configured to receive programmable settings from a controller circuit to selectively program a set of memory registers of the plurality of memory registers to store the digital values. Further, the preamplifier can include a second interface to provide the digital values to the controller circuit.

In some embodiments, a method can include selectively programming a set of memory registers of a plurality of memory registers to store a digital value corresponding to data converter samples, acquiring a signal sample from an analog signal, converting the signal sample to the digital value, and storing the digital value to the set of memory registers.

BRIEF DESCRIPTION OF THE DRAWINGS

FIG. 9A is a functional block diagram of a system of assignable registers on a preamp chip, in accordance with certain embodiments of the present disclosure;

FIG. 9B is a functional block diagram of a system of assignable registers on a preamp chip, in accordance with certain embodiments of the present disclosure.

DETAILED DESCRIPTION

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

Figure 1:
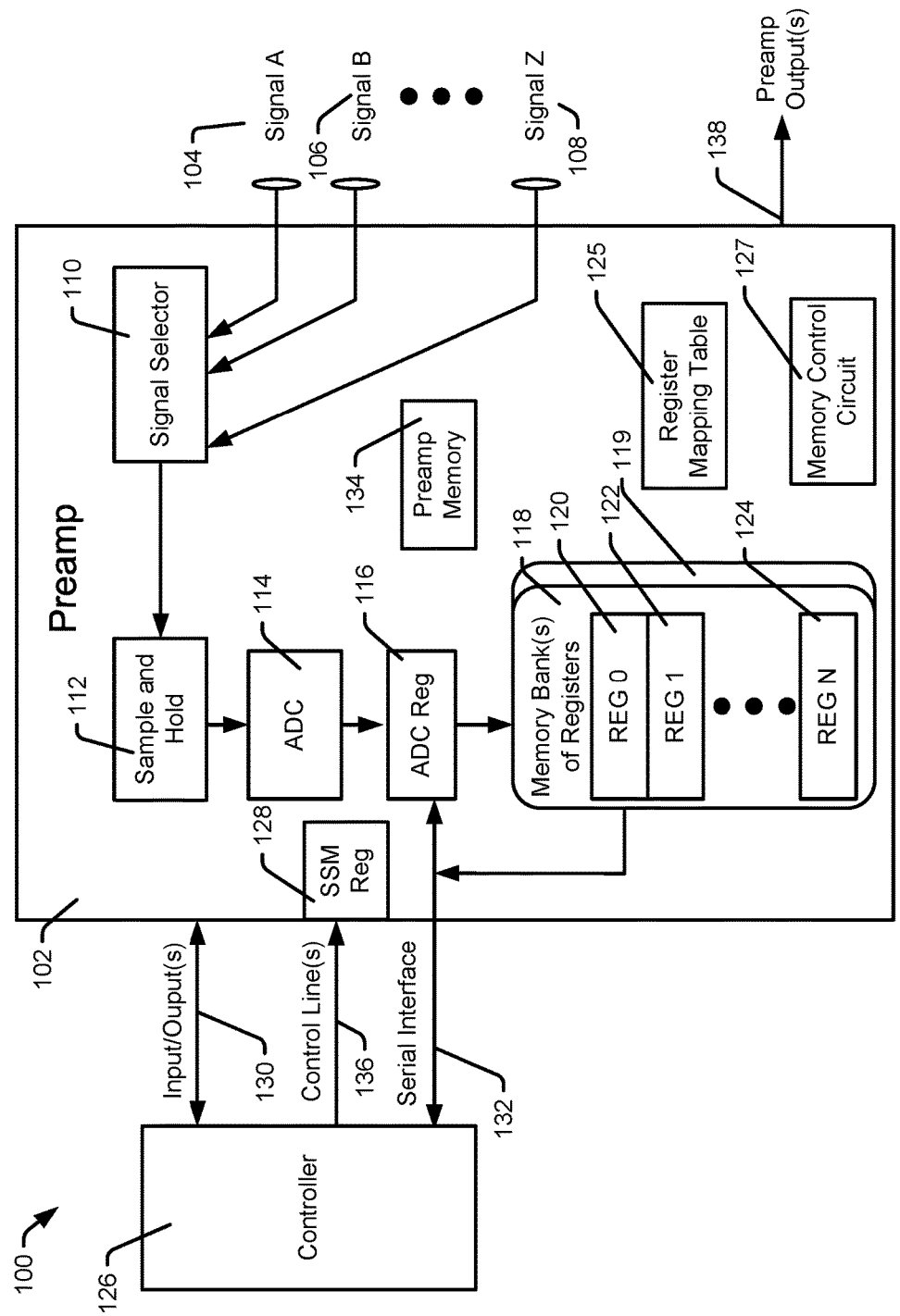
FIG. 1 is a block diagram of a system of assignable registers on a preamp chip, in accordance with certain embodiments of the present disclosure.

Referring to FIG. 1, a block diagram of a system of assignable registers on a preamp chip is shown and generally designated 100. The system 100 can include a preamplifier ("preamp") circuit 102 and a controller circuit 126. The controller 126 may be a data storage controller, processor, read/write channel, system on chip ("SOC"), application specific integrated circuit ("ASIC") or other device. The preamp circuit 102 can include a signal selector circuit 110 (e.g. digital multiplexer circuit(s)), sample and hold circuit 112, data converter circuit (e.g. an analog-to-digital converter ("ADC") circuit) 114, an ADC output register 116, programmable control settings or register(s) 128, register mapping table 125, a memory 134, and a memory bank of registers 118. The preamp 102 may optionally include other memory banks of registers, such as the memory bank of registers 119. In some embodiments, the preamp circuit 102 may be an SOC, ASIC, integrated with the controller 126, or other device. The memory 134 may be dynamic random access memory ("DRAM"), assignable or dedicated registers, other memory, or any combination thereof. The preamp 108 can include an output(s) 138. The preamp output(s) 138 may be current to power a laser, a write signal for a magnetic write head, other output, or any combination thereof.

The memory bank of registers 118 may be a virtual grouping of assignable memory contained in the preamp 102 that are assigned to store digital values produced by the ADC 114. Thus, the assignment of registers can create a cache to store ADC sampling data within the preamp circuit itself. The assignable memory may be assignable portions of DRAM, assignable registers, or other memory. The memory bank of registers 118 may be referred to as a preamp cache. Assignable registers may be registers that can be assigned to store data for different functions or operations. The memory bank of registers 118 can include a multiple registers such as register zero 120, register one 122, through register N 124. The registers may be a logical grouping assigned to store digital values produced by the ADC 114. In some cases, one or more of the registers may be utilized for a first assigned purpose other than storing ADC samples, and the registers may then be reassigned (e.g. re-purposed) from other functions when those functions are not in need of the register. For example, in data storage devices, certain modes of operation may only be used during drive processing, such as servo bank writing. The registers associated with the servo bank writing may be then repurposed during drive use for the ADC sampling. There may be other circumstances in which a register may be assigned to store ADC samples. For example, registers that have not been previously assigned to a function can be assigned to store ADC samples. Some systems may have more than one memory bank of registers, such as memory bank 119, thus providing multiple logical groupings of memory. A number of registers assigned to each memory bank of registers may be the same or different. Memory banks of registers may store different data. For example, a memory bank of registers may store digitized data samples, another memory bank of registers may store difference data, and so forth.

In some embodiments, individual bits within the registers may be assigned to store ADC samples. If the bits selected for assignment are already assigned to another function, the selected bits may be assigned to store samples when the other function is disabled. For example, in data storage device with servo writing functions, bits assigned to a servo copy function may be assigned to store samples when the servo copy function of the preamp 102 is disabled.

The controller 126 may send or receive signals, such as signal sample acquisition signals, power on/off signals, or other signals to the preamp 102 via input/output lines 130. Further, the controller 126 may determine which registers or bits may be assigned to the memory bank of registers 118, and may have prior knowledge of which registers or bits in the preamp 102 are assignable. The controller 126 may set (or clear) a control bit to assign selected registers to store ADC samples, thus creating the logical grouping of registers 118.

Also, the controller 126 may assign a subset of registers and bits to the memory bank of registers 118. For example, the controller 126 may set or clear one or more bits corresponding to individual registers listed in the register mapping table 125 to assign them for storing ADC samples as part of the memory bank of registers 118. The controller 126 may limit a number of registers and bits assigned for storing ADC samples, which may enable the controller 126 to perform calculations faster due to less than all of available registers being utilized to store data.

In some embodiments, the controller 126 may assign the assignable registers and bits on the fly. The assignable registers and bits can be assigned to various memory banks of registers. For example, the preamp 102 may have 128 assignable registers, 64 of which may be assigned to a memory bank of registers that store data corresponding to Signal A 104, 32 of which may be assigned to store data corresponding to Signal B 106, and 32 of which may be assigned to a memory bank of registers that store data corresponding to Signal Z 108. If more registers are needed to store data corresponding to Signal Z 108 than are already assigned, registers corresponding to Signal A 104, Signal B 106, or both, may be reassigned to store data corresponding to Signal Z 108.

The methods and functions described herein may be performed by a memory control circuit 127, which may include programmable logic, hardware gates, a controller, or other circuits that allow the system operations to be performed. For example, the memory control circuit may monitor one or more bits of a control register to determine when preamp caching is enabled, or which signal is selected, or which registers are enabled to be included in the memory bank of registers.

During operation, the signal selector 110 can route Signal A 104, Signal B 106, or Signal Z 108 to the sample and hold circuit 112. In some systems, there may be multiple sample and hold circuits to allow simultaneous sampling of multiple analog signals. Signal A 104, signal B 106, and signal Z 108 may correspond to multiple analog signals, such as read signals, test signals, or other signals. For example, Signal A 104 may be a signal from a transducer or receiver, Signal B 106 may be a laser power monitor signal corresponding to a power output of a laser diode, and Signal Z 108 may be a test signal corresponding to a transducer's resistance, bias, heater power, or heater resistance. The signal selector 110 may be directed to select which of the Signal A 104, Signal B 106, or Signal Z 108 based on instructions (e.g. control lines) from the controller 126. The controller 126 can set or clear one or more bits in a control register to program the signal selector circuit 110. Further, the controller 126 can program the selector circuit 110 to select multiple signals. The selected multiple signals may be routed to the controller 126 or other circuit(s) within the preamp to be combined. In some cases, the selected multiple signals may be digitized, and the digitized samples could then be combined via logical operations (e.g. AND, OR, etc.). The selected multiple signals may be combined in the analog domain via amplifiers, mixers, or other circuits to produce a combined signal. The combined signal may then be provided to the sample and hold circuit 112.

The sample and hold circuit 112 can acquire a sample of the selected signal at a point in time. The signal sample may be provided to the ADC 114 where it can be digitized into a digital value. The digital value may be stored into the specific ADC output register 116. However in some embodiments, the digital value may be stored to the memory 134 as a read value. The read value may be stored to the ADC specific register 116, used in arithmetic calculations (e.g. averaging, differencing), used for other purposes, or any combination thereof. The ADC specific register 116 may be a read back register, which can be a register dedicated to store a digitized value of the signal sample. Thus, the ADC register 116 may not be programmable to be selectively enabled to be included in the memory bank of registers 118. The feedback register may receive digital values even if digital values are not stored to the memory bank of registers 118.

A manner in which the digital value is stored in the memory bank of registers 118 may be determined by a setting of the bits in the control register(s) 128. The controller 126 may program one or more bits in the control register(s) 128 via the control line(s) 136. The control register(s) 128 may be a register bank including multiple registers. Bits in the control register(s) 128 may be set or cleared to cause digital values to be stored in a certain way. For example, when bits in the control register(s) 128 are programmed to a first value, digital values may be stored to the ADC register 116 only and the memory bank of registers 118 is not utilized. When bits in the control register(s) 128 are programmed to another value, the memory bank of registers 118 may be utilized and the digital values may be moved (e.g. buffered) from the ADC register 116 to the memory bank of registers 118. When digital values are moved via buffering, the digital values may be moved from one or more current registers to a memory, such as the preamp memory 134, and then from the memory to one or more other registers. Digital values can be moved from register (REG) zero 120 to REG N 124 one register at a time, as new data samples are acquired and placed into preceding registers. For example, the memory bank of registers may operate as a first-in first-out (FIFO) buffer where a most recent digital value may be stored to REG zero 120 and the digital value in REG N 124 may be the oldest digital value in the memory bank of registers 118, which may be deleted (e.g. overwritten without being copied or moved elsewhere) from the memory bank of registers 118 when a new digital value is stored to REG zero 120 and the rest of the memory bank of registers move its data down one.

In some embodiments, if the preamp 102 is configured to stop signal sample acquisitions when requirements are fulfilled (e.g. a predetermined number of signal samples have been acquired, digitized, and stored to the memory bank of registers 118) a new signal sample acquisition can cause the preamp 102 to clear all of the registers in the logical grouping of registers 118 before storing new samples to the registers. The memory bank of registers may be cleared (zeroed out) by setting all of the bits in the memory bank of registers to a logical zero.

In some embodiments, the preamp 102 may include a setting of control register 128 that may not clear the registers after acquisition of signal samples stops. Thus, when a new acquisition causes the preamp 102 to resume moving the digital values from REG zero 120 to REG N 124 the pre-stopped data will still be part of the older samples (e.g. the memory bank of registers 118 may not be cleared).

Further, the control register 128 may allow for other modes of operation to be performed by the preamp 102. For example, the control register 128 may include bits that may be programmed to cause the preamp 102 to store difference values, determine a mode of acquiring and digitizing signal samples, determine a manner in which the data in the memory bank of registers 118 are provided to the controller 126, and so forth.

Once one or more digital samples are acquired, the controller 126 may read some or all of the digital values in the ADC register 116 and in the memory bank of registers 118 via a serial interface 132. Once the controller 126 has received the samples from preamp 102, the controller 126 may perform signal analysis on the selected signal based on the digital values. For example, in a disc drive application, the controller 126 may perform signal analysis on a signal corresponding to a transducer's resistance, and then make adjustments to the transducer's fly-height distance from the disc based on the signal analysis.

In some embodiments, the preamp 102 may include multiple acquisition circuits. For example, the preamp 102 may include multiple sample and hold circuits 112, multiple ADCs 114, multiple specific ADC registers 116, and other components, which can allow the preamp 102 to acquire, digitize, and store samples from multiple signals concurrently.

Figure 2:
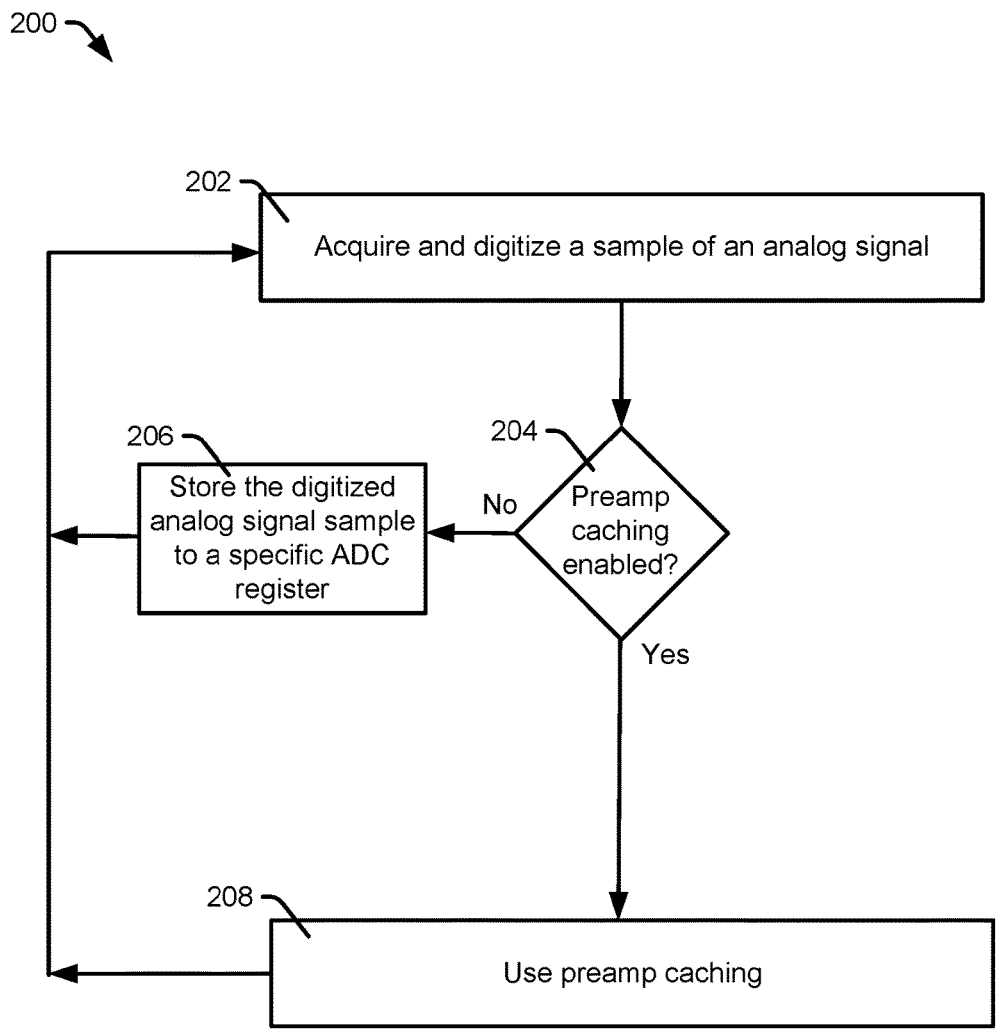
FIG. 2 is a flowchart of method of assignable registers on a preamp chip, in accordance with certain embodiments of the present disclosure.

Referring to FIG. 2, a flowchart of method of assignable registers on a preamp chip is shown and generally designated 200. The method 200 may be implemented by the system 100 and the other systems described herein. The method 200 can include acquiring and digitizing a sample of an analog signal, at 202, such as by system 100 describe with respect to FIG. 1. Then, method 200 may determine if preamp caching is enabled, at 204. Preamp caching, which can utilize a memory bank of registers to store additional digital samples in a preamplifier circuit, can be enabled and disabled by setting one or more bits in a control register.

When the preamp caching is not enabled, the method 200 can include storing a single digital sample or value to a specific ADC register, at 206 (such as the specific ADC register 116 shown in FIG. 1) and any digital sample or value already in the specific ADC register will be overwritten. When preamp caching is not enabled, the memory bank of registers 118 is not used, and the digital sample may not be moved from the specific ADC register to the memory bank of registers.

Figure 3:
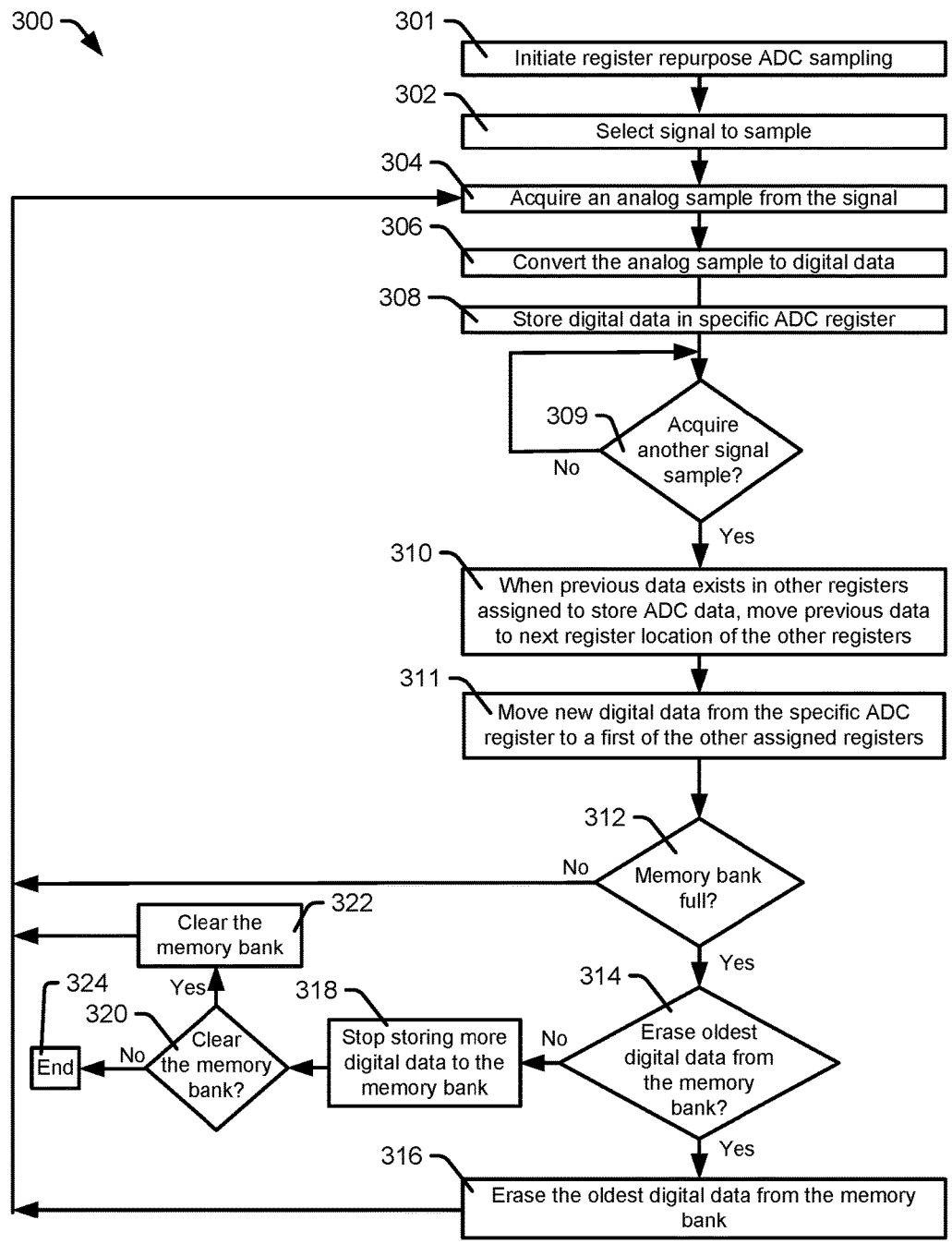
FIG. 3 is a flowchart of method of preamp caching, in accordance with certain embodiments of the present disclosure.

When preamp caching is enabled, the method 200 can include using preamp caching, at 208. Preamp caching can allow data stored in the specific ADC register to be moved to a memory bank of registers (such as the memory bank of registers 118 shown in FIG. 1) when a new signal sample is acquired and digitized. This can prevent existing sample or data in the specific ADC register from being lost when a new sample is stored. FIG. 3 shows an example flowchart of preamp caching.

Referring to FIG. 3, a flowchart of a method of preamp caching is shown and generally designated 300. The method 300 may be implemented by the system 100. The method 300 can begin by initiating a register repurposing (assigning) operation, at 301. Assignable registers in a preamp (such as the preamp 102 shown in FIG. 1) may be virtually grouped into one or more preamp caches (such as the memory bank of registers 118 or 119 shown in FIG. 1), which may have an equal or different number of registers. A controller, such as the controller 126 shown in FIG. 1, can repurpose the assignable registers by setting or clearing bit(s) in a control register (such as the control register 128 shown in FIG. 1).

The method 300 can include selecting an analog signal to sample, at 302. In some examples, a controller, processor, read/write channel, or other device may transmit an indicator to a preamp to select an analog signal to sample. A selector circuit (such as the signal selector 110 shown in FIG. 1) receiving the signals can be configured to provide the selected analog signal to acquisition circuits to sample.

A sample of the selected signal may be acquired, at 304, and converted into new digital data, at 306. Signal acquisition circuits, such as the sample and hold circuit 112 shown in FIG. 1, can acquire a sample of the selected analog signal at a point in time. An ADC, such as the ADC 114 shown in FIG. 1, can convert the selected analog signal sample into a digital value. The digital value may be stored to a specific ADC register, such as the ADC specific register 116 shown in FIG. 1, at 308. In some examples, the digital value may be temporarily stored to a memory (such as the preamp memory 134 shown in FIG. 1) until it can be moved to the specific ADC register.

The method 300 can include determining if another signal sample may be acquired, at 309. In some cases, another signal sample may be acquired when a trigger is detected. A trigger may be a signal from a controller to cause the preamp (such as the preamp 102 shown in FIG. 1) to acquire just one sample, or may be a rising or falling edge of a digital signal, clock signal, combinational logic signal (e.g. logical combination of signals, such as via AND or OR operations), or other signals. For example, a trigger may occur when an amplitude of analog signal exceeds a threshold voltage, or a current exceeds a threshold level. In some examples, a logical combination operation can be performed to combine multiple signals (e.g. a clock signal combined with a servo gate signal) and could be used to determine when to trigger a sample to be taken. The signals in the logical combination operation could also be other signals, such as a laser control signal, write control signal, or any combination of the signals in the controller or the preamp. The logical combination of signals may be implemented via a circuit or firmware in the controller 126 or preamp 102, such as in the control circuit 127.

In some cases, the preamp may be configured to continuously acquire, digitize, and store samples. Once a trigger is detected, the preamp may acquire samples until a stop indicator is received, if one is received at all. A stop indicator may be provided by a controller when acquisition requirements have been met (e.g. a threshold number of samples have been acquired, sample acquisition has continued for a threshold amount of time, etc.). Further, a stop indicator may be provided when acquired signal samples would be invalid or of no use. For example, acquisitions may be stopped when a recording head in a data storage device ("DSD") is over a servo sector. When another signal sample may not be acquired, the method 300 may determine if another signal sample can be acquired, at 309. In some instances, another signal sample may always be acquired, that is there is no stop indicator for the system, and the specific ADC register will always be overwritten with new sample data.

When another sample is acquired, and previous data exists in other registers assigned to store ADC data, the method 300 can include moving the previous data to a next register location of the other registers, at 310. For example, data in register zero (such as the register zero 120 shown in FIG. 1) may be moved to register one (such as the register one 122 shown in FIG. 1), and so forth. All of the data in the registers may be moved to the next register in a memory bank, thus making room in the first register of the memory bank for the new digital value stored in the specific ADC register. However, in some examples, the digital values may remain in their respective registers, but the registers may be assigned to a different logical position in the memory bank, such as via pointers or other methods to create a first-in first-out buffer. When the data has been stored to the next registers, the data from the specific ADC register may be moved to the first register of the other assigned registers, at 311.

The method 300 can include determining if the memory bank is full, at 312. The memory bank may be full when all of the assigned registers contain non-zero data. When the memory bank is not full, the method 300 can continue to acquire analog samples from the analog signal, at 304, and storing a next acquired sample data to the memory bank, at 311. When the memory bank is full, the method 300 can determine if oldest digital data may be erased from the memory bank, at 314. The oldest digital data may be stored in a last register of the memory bank. When the digital data can be erased, the method 300 can include erasing the oldest digital data from the memory bank, at 316. One way the oldest digital data can be erased is to overwrite the last register with other data, such as from the next to last register. Then, the method 300 can continue to acquire analog samples from the signal, at 304. When the oldest digital data is not to be erased from the memory bank, the method 300 can include stopping further data from being stored to the memory bank, at 318. A controller can provide a stop acquire indicator by setting or clearing bit(s) of a control register to prevent further data from being stored.

The method 300 can include determining if the memory bank should be cleared, at 320. Control bit(s) may be programmed to cause the registers in the memory bank to be cleared, at 322, which can occur by overwriting all bits in the registers to zeros. When the registers in the memory bank have been cleared, the method 300 can include acquiring an analog sample from the signal, at 304. When the registers in the memory bank cannot be cleared, no more analog samples from the signal may be acquired, and the method 300 can end, at 324. Operations 310 through 322 can be an example of the preamp caching operation 206, shown in FIG. 2. For example, when preamp caching is not enabled, a sampling method can include steps 302 to 309 and will loop from step 309 to step 304 when another sample is acquired.

Figure 4:
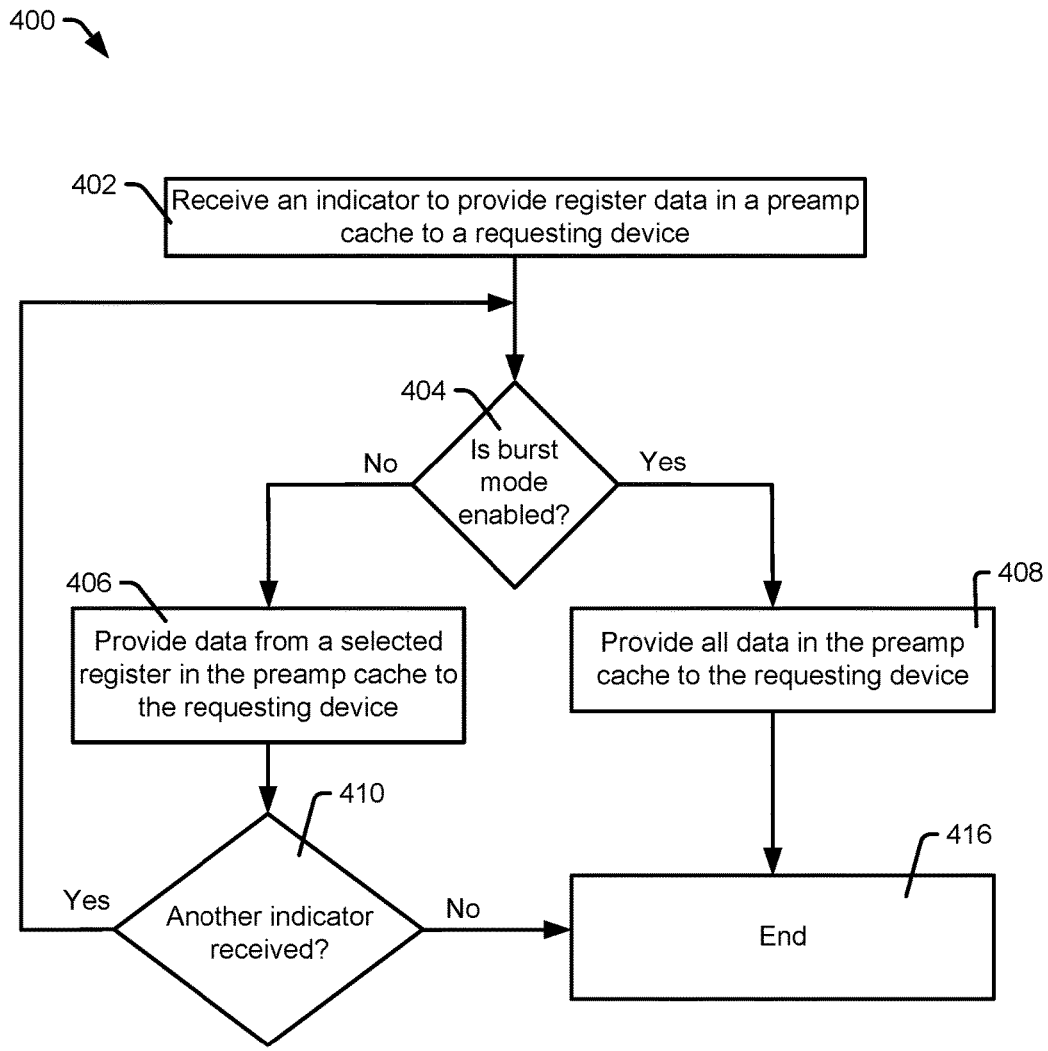
FIG. 4 is a flowchart of method of assignable registers on a preamp chip, in accordance with certain embodiments of the present disclosure.

Referring to FIG. 4, a flowchart of method of assignable registers on a preamp chip is shown and generally designated 400. The method 400 may be implemented by the system 100. The method 400 can include receiving an indicator to provide register data in a preamp cache (such as the memory bank of registers 118 shown in FIG. 1) to a controller (such as the controller 126, shown in FIG. 1), at 402. The method 400 can include determining if a burst mode is enabled. A burst mode may be enabled when a controller sets or clears a bit(s) in a control register. When the burst mode is enabled, the method 400 can include transmitting all of the data in the preamp cache to the controller, at 408. The data may be transmitted to the controller in sequence, which can mean the data in a first register in the preamp cache is transmitted, then data in a second register in the preamp cache is transmitted, and so forth, until data in a last register is transmitted to the controller. The transmission of data from all of the registers in the preamp cache may be based on a single data request from a controller. For example, the controller may send a single request for the contents in the first register only, but when burst mode is enabled the controller will receive all of the data from all of the registers assigned for preamp caching in response to the single request. When all of the data in the preamp cache has been successfully transmitted to the controller, the method 400 may end, at 416.

When burst mode is not enabled, the method 400 can include transmitting data from a selected register in the preamp cache to the controller, at 406. The method 400 can include determining if an indicator to provide more register data to the controller has been received, at 410. When the indicator has been received, the method 400 can include determining if burst mode is enabled, at 404. When an indicator has not been received, the method 400 can end, at 416.

Figure 5:
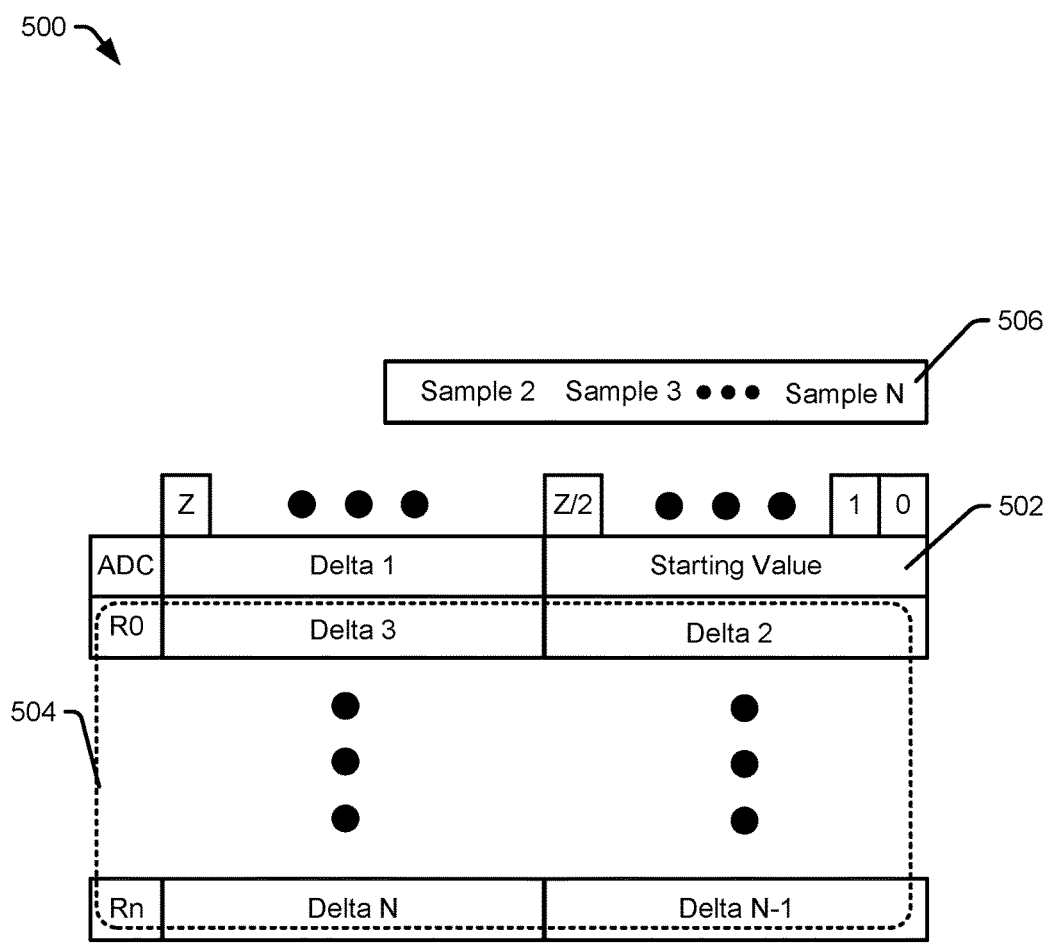
FIG. 5 is a memory bank of assignable registers on a preamp chip, in accordance with certain embodiments of the present disclosure.

Referring to FIG. 5, a memory bank of assignable registers, such as on a preamp chip, is shown and generally designated 500. The table of registers 500 can include a memory bank of registers 504 (such as the memory bank of registers 118 shown in FIG. 1). The memory bank of registers 504 may include a number N of assignable registers. Each of the assignable registers may have a same bit width, Z bits wide. For example, the registers may be 8 bits wide, 16 bits, wide, 32 bits wide, and so forth.

In some embodiments, the registers may be utilized to store difference data instead of raw ADC sample data. Difference data may be a difference (e.g. delta) between a starting value and a signal sample. Since the delta may be less than an amplitude of a signal sample (e.g. 10 millivolts vs. 500 millivolts), fewer bits may be used to represent the selected signal. For example, it may require Z/2 bits to represent a delta value, but Z bits to represent the signal sample. Thus, twice as much data may be saved to the memory bank of registers 504 by storing delta values than signal sample values. However, a bit width of a delta value may be larger or smaller than Z/2. For example, a delta value may be Z/4 bits wide. Storing difference data can reduce an amount of memory resources used to store data representing a portion of a selected signal.

The delta values may be calculated by subtracting digitized signal sample values (readings) stored in a memory 506 (such as the preamp memory 134 shown in FIG. 1) from a starting value 502. The starting value 502 may be stored in an ADC specific register 502 (such as the ADC specific register 116 shown in FIG. 1). A starting value can be a digitized value of a signal sample. A point in time at which the starting value is acquired may be based on a trigger from a controller, a rising or falling edge of a digital signal, or other trigger.

The memory 506 may store data samples for one or more additional samples. For example, multiple sample values may be stored in the memory 506, or a sample value may be overwritten each time a sample value is digitized. In some cases, the memory 506 may be another memory bank of registers, a buffer to store the digitized signal samples as they are produced, or other memory. When a sample is stored to the memory 506, the sample can be compared to the starting value 502. The delta between the sample and the starting value 502 can be stored in a register in the memory bank of registers 504. Each of the Deltas one through N may be determined by subtracting a sample value from the starting value 502.

The memory bank of registers 504 may store the delta values to the registers in the memory bank of registers in sequential order until a delta value is stored to register N, at which point, a delta banking control enable bit may be cleared, and no more data may be stored to the registers in the memory bank of registers 504. When, the delta banking control enable bit is set, all of the delta values in the memory bank of registers 504 may be cleared. However, as shown in method 300, various embodiments can be implemented in which the delta values are not cleared or not stopped; thus, methods 200, 30, or 400 may be operated utilizing raw sample data, difference values, or other data stored in the assignable preamp caching registers.

In some embodiments, the delta values may be 2's complement to include a positive or negative indicator since the delta may be plus or minus. For example, each delta value may include one sign bit and seven data bits when the delta value is 8 bits wide.

Figure 6:
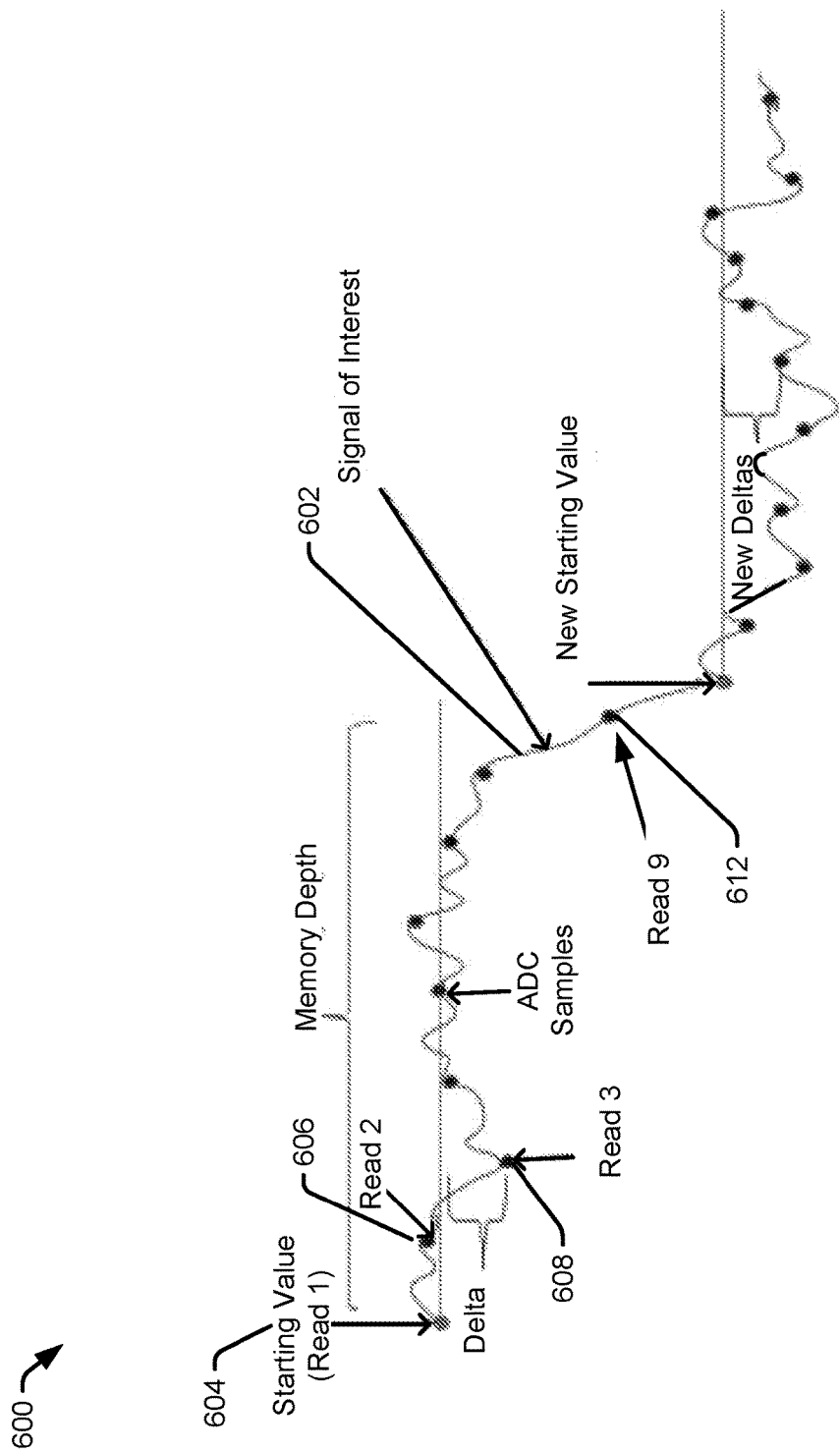
FIG. 6 is a delta waveform, in accordance with certain embodiments of the present disclosure.

Referring to FIG. 6, a delta waveform is shown and generally designated 600. The waveform 600 can include a signal 602, which may be sampled by a preamp circuit (such as the preamp circuit 102 shown in FIG. 1) to produce read values, such as read one 604, read two 606, read three 608, and read nine 612. Read one 604 may be stored to a read back register (such as the ADC specific register 116 shown in FIG. 1) as a starting value. Read two 606, read three 608, and read nine 612 may be stored to a buffer or other memory (such as the preamp memory 134 shown in FIG. 1, or the memory 506 shown in FIG. 5) as they are acquired. Read two 606, read three 608, and read nine 612, may be compared to the starting value 604, and a difference stored to a registers in a memory bank of registers. As shown in FIG. 6, memory bank of registers may have a limited memory depth and thus only capable of holding a limited amount of data, which may be less than all of the sample points of the signal of interest. Further, based on a trigger such as a timing signal or indicator from a controller, the starting value may be replaced with a new starting value.

Figure 7:
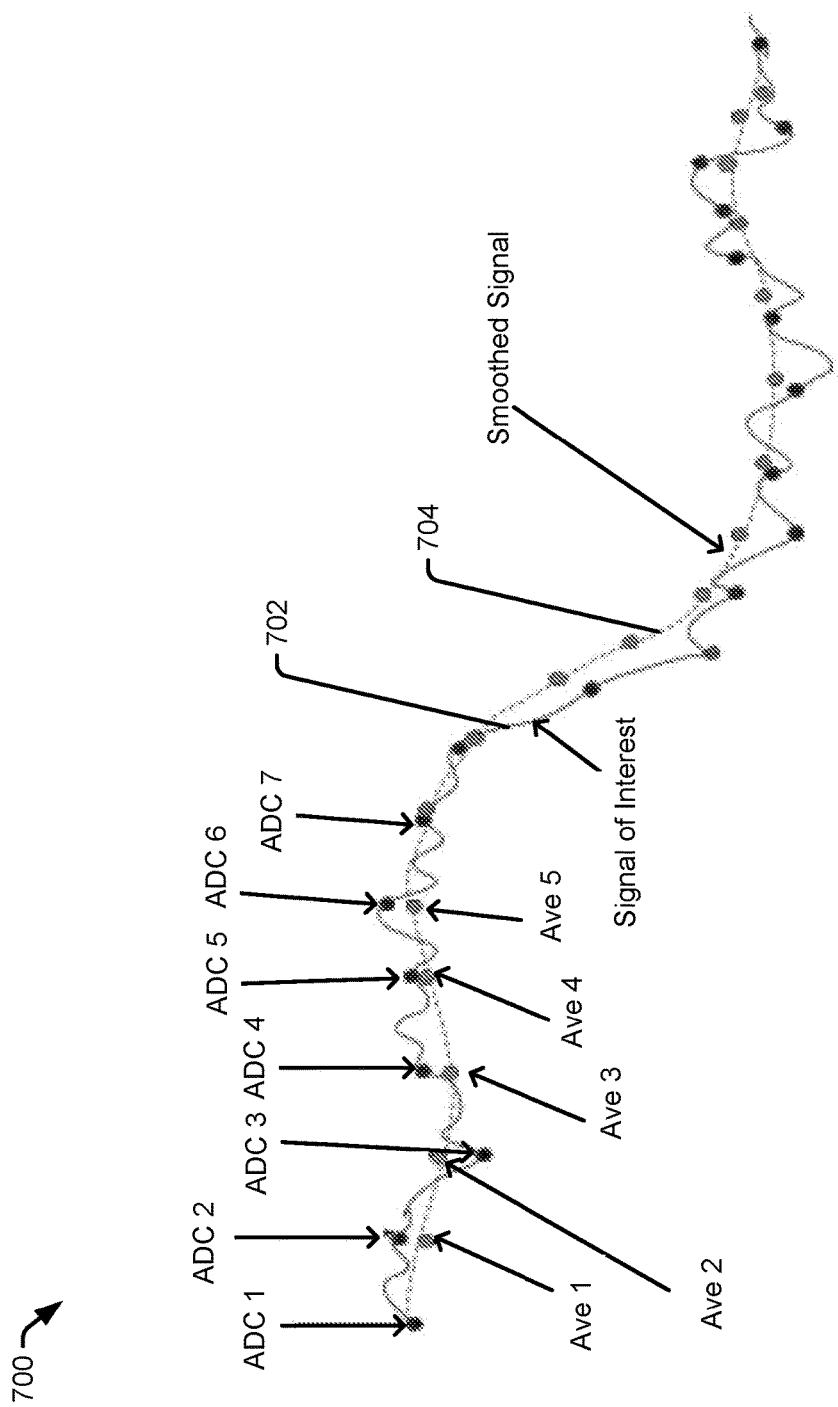
FIG. 7 is a smoothing waveform, in accordance with certain embodiments of the present disclosure.

Referring to FIG. 7, a smoothing waveform is shown and generally designed 700. Waveforms may be smoothed (e.g. low pass filtered) to reduce noise. The signal of interest 702 may be averaged to produce the smoothed signal 704 via a preamp (such as the preamp 102 shown in FIG. 1) without the added cost of a digital signal processor, or occupying a footprint of an analog filter. The average may be a running average, where average values are calculated as signal samples are acquired and digitized. The preamp could average more than one digital value, such as adjacent samples in time, and store the average to a memory bank of registers (such as the memory bank of registers 118 shown in FIG. 1). A current ADC value and a next ADC value may be averaged, and the resulting average value may be updated to a memory bank of registers. In some cases, signal smoothing can be achieved by averaging a current sample with a previous sample and a next sample to create a new (e.g. average) value corresponding to the current sample. The new value could then be stored to the memory bank of registers. This can be repeated to achieve the signal smoothing. In some cases, average values may be determined by averaging existing digital values. For example, Ave 5 may be determined by averaging ADC 1 through ADC 5, or by averaging Ave 1 through 4 with ADC 6.

Figure 8:
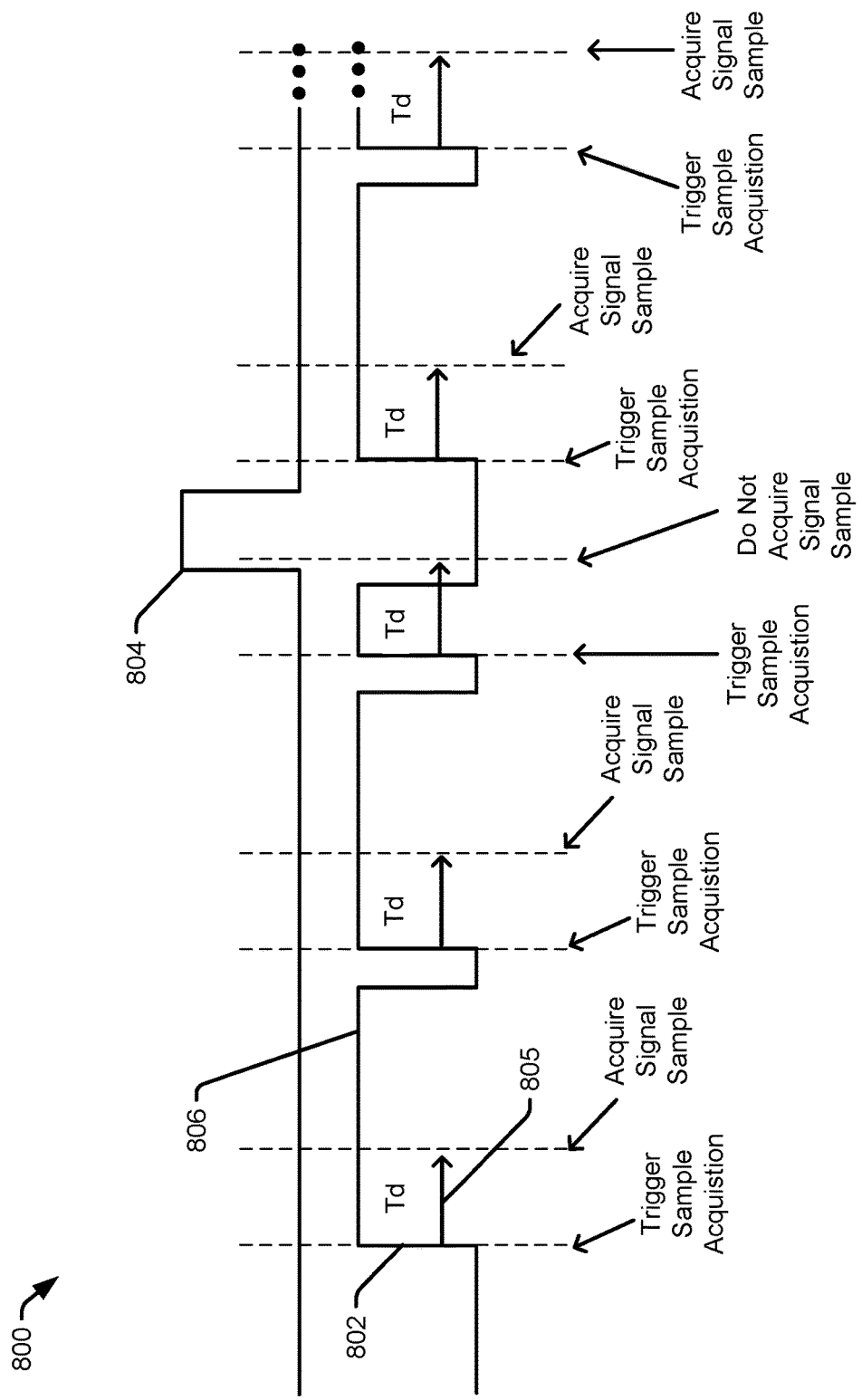
FIG. 8 is a diagram of signal sample acquisition for assignable registers on a preamp chip, in accordance with certain embodiments of the present disclosure.

Referring to FIG. 8, a diagram of signal sample acquisition for assignable registers on a preamp chip is shown and generally designated 800. A preamp can be programmed to acquire and store read signals without receiving a trigger indicator for each acquisition from a controller. The preamp can be configured to acquire, digitize, and store signal samples upon detection of a rising or falling edge of a digital signal, such as a clock signal 806, which can result in an acquisition of sample values at equally spaced time intervals. In some embodiments, the clock signal 806 may be a write-enable signal from a data store controller. The clock signal 806 can be a signal whose rising or falling edges correspond to events of interest, such as a power on signal, power save signal, read gate (e.g. a signal that can cause the preamp to read data from a disc storage), write gate (e.g. a signal that can cause the preamp to write data to a disc storage), or other signals. For example, it may be desirable to analyze a laser power monitor signal when a laser is turned on, such as when heat-assisted magnetic recording is utilized to store data.

In some embodiments, signal samples may be acquired when control bit(s) is enabled, and stopped when the control bit(s) is disabled. This can allow for a controller to set a time interval for when the samples would be acquired. A rate at which the samples could be acquired, digitized, and stored to preamp cache may be based on available sampling rates of an ADC, or other factors.

Further, as shown in FIG. 8, a time between when a rising edge 802 of the write-enable signal 806 is detected and when the sample can be acquired may be based on a time delay 805, Td. A controller may determine a length of Td 805 based on system resources, which signal is to be analyzed, to guarantee that data acquisition will occur in a desired time window, or any combination thereof. For example, it may take a period of time for a laser to reach full power after a rising edge indicator is detected. A read acquisition may be delayed by Td 805 to allow the laser reach full power before signal samples are collected. Td 805 may be programmed into a preamp (such as via control register(s)) by a controller. Further, a time between when a trigger indicator is detected and a corresponding digital value is stored may be based on an amount of time required by an ADC to convert an analog sample to digital data.

There may be instances where it is desirable to not acquire a signal sample even though a trigger has been detected, such as when acquiring a signal sample may result in unwanted or invalid data. For example, one may want to prevent acquiring samples when an operation mode of the preamp changes (e.g. intersector gap mode), signals known to cause interference are turned on, a recording head is over a servo wedge, and so forth. The preamp can be programmed to ignore acquisition triggers during such occurrences or time periods. For example, the preamp can be programmed to not acquire a signal sample when another signal, such as signal indicating a position of the recording head is high, at 804.

Referring to FIG. 9A, a functional block diagram of a system of assignable registers on a preamp chip is shown and generally designated 900. The system 900 can include a memory bank of registers 916, recording head one 902, recording head two 904, recording head three 906, and recording head four 908. The recording head one 902, recording head two 904, recording head three 906, and recording head four 908 may be coupled to a sample and hold circuit 910 (such as the sample and hold circuit 112 shown in FIG. 1). The sample and hold circuit 910 can be coupled to an ADC 912 (such as the ADC 114 shown in FIG. 1). Some systems can include more or fewer recording heads.

It may be desirable for parameters of more than one recording head to be sampled when a trigger indicator is detected. Therefore, a sample head stack ("SHS") mode may be enabled to allow a controller to sample multiple channels coupled to a preamp, thus allowing the controller to poll signals of interest from multiple recording heads. A preamp channel may be coupled to a recording head. For instance, if a signal of interest from a recording head corresponding to read head resistance is sampled and converted to a digital value, the preamp could sample signals from other recording heads without receiving another acquire indicator from the controller. In a case of a four channel preamp, some or all of the four preamp channels may be sampled, one after the other, without the controller writing a different command request to sample individual recording head signals. For example, the sample and hold circuit 910 can acquire an analog sample from the recording head one 902, then acquire an analog sample from the recording head two 904, and so forth. In some examples, the sample and hold circuit 910 may include a selection circuit that can be configured to route the analog signals to the sample and hold circuit 910. A bit may be enabled to cause the selection circuit to route a signal from the recording head one 902 to the sample and hold circuit 910, then route a signal from the recording head two 904 to the sample and hold circuit 910, etc. In some cases, a register may be programmed by the controller to determine which preamp channels are to be sampled. The controller may program a register to select an order in which the preamp channels are sampled.

The samples may be digitized by the ADC 912 and stored to the memory bank of registers 916, at 914. The samples can be stored to a selected memory bank with provisions to be able to program identifiers to allow the controller to a location of beginning data (e.g. from the recording head one 902) and ending data (e.g. from the recording head four 908) corresponding to signals from the multiple preamp channels. The digital values may be stored to the memory bank of registers 916 in an order in which they were acquired. For example, if a sample from recording head one 902 was acquired first and a sample from recording head two 904 was acquired next, digital data corresponding to recording head one 902 may be stored to R0, and digital data corresponding to recording head two 904 may be stored to R1.

The identifiers may be stored to the memory bank of registers to allow the controller to know which digital value(s) in the memory bank of registers correspond to which analog signal. An identifier could be a combination of writing all zeros to a register prior to when a first signal is sampled, and writing all zeros to a register after a last signal is sampled, or an entry in a register to indicate where data corresponding to a specific recording head is stored.

Examples of when SHS may be enabled can include when a servo bank write feature is enabled (e.g. writing data to, or reading data from multiple surfaces at one time), multiple recording head read or multiple recording head write features are enabled, other configurations, or any combination thereof.

Referring to FIG. 9B, a functional block diagram of a system of assignable registers on a preamp chip is shown and generally designated 900. FIG. 9B can depict an operation of the system 900 when SHS is not enabled. A controller may be required to send separate requests to a preamp to sample a signal of interest from the recording head one 902, recording head two 904, recording head three 906, or recording head four 908. This can require the controller to request a head switch (e.g. programming one or more registers in the preamp to select a recording head to sample), and then acquire a sample of the signal of interest when requirements (e.g. receiving an acquisition indicator) are met. For example, the controller can send a request to the preamp to sample a signal of interest from the recording head one 902. A selector circuit in the preamp can be programmed by the controller to route the signal of interest from the recording head one 902 to the sample and hold circuit 910, where an analog sample may be acquired. The analog sample may then be digitized by the ADC 912 and stored to R0 in the memory bank of registers 916. To acquire a signal from another recording head, the controller would have to request another head switch and a sample acquisition process may begin again.

Figure 10:
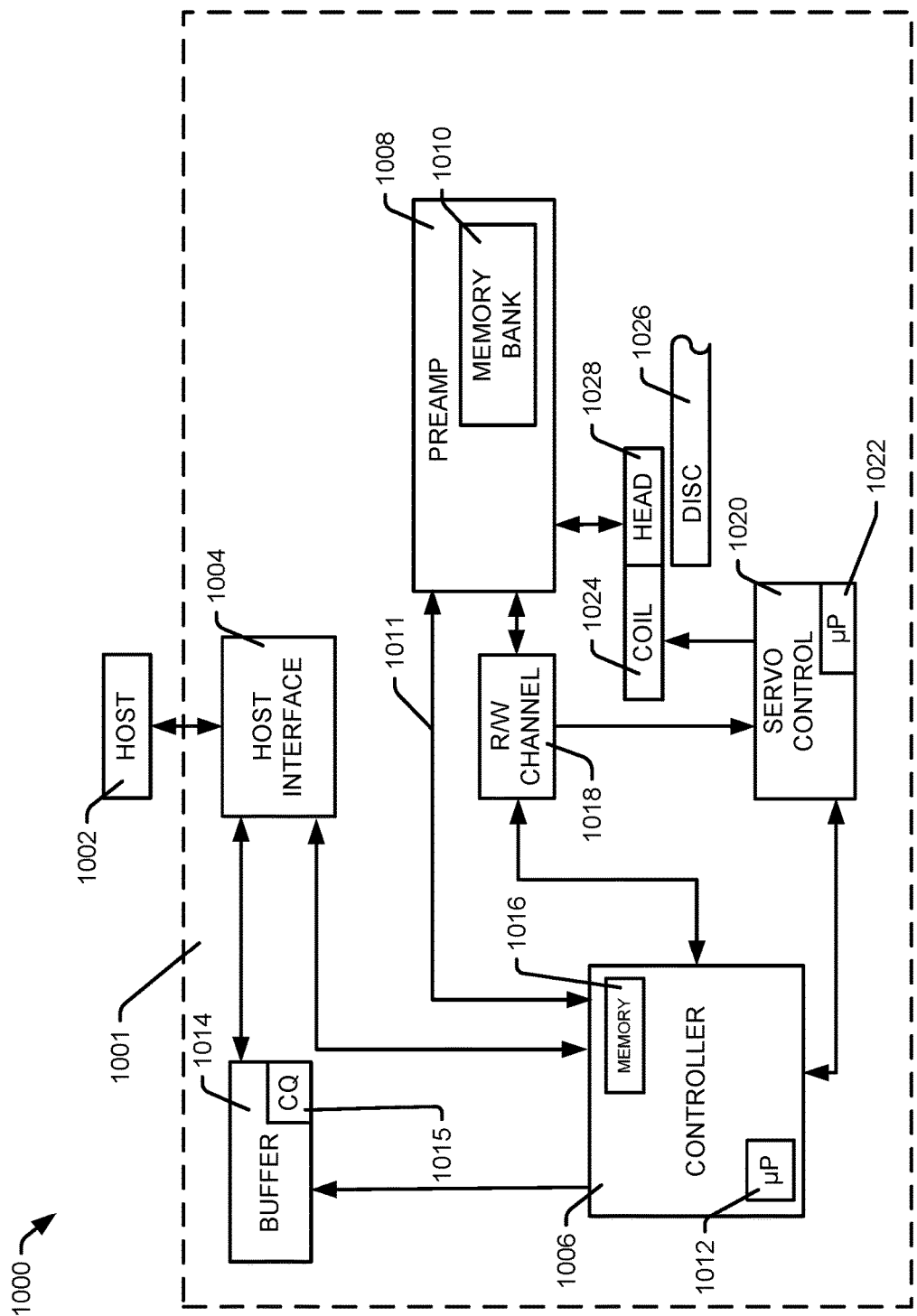
FIG. 10 is a block diagram of a system of assignable registers on preamp chip, in accordance with certain embodiments of the present disclosure.

Referring to FIG. 10, a block diagram of a system of assignable registers on preamp chip is shown and generally designated 1000. The system 1000 may include a preamp 1008 with a memory bank of registers 1010 implemented in a data storage device ("DSD") 1001. The preamp 1008 may be the preamp 102 shown in FIG. 1, and the memory bank of registers 1010 may be the memory bank of registers 118 shown in FIG. 1. The controller 1006 may be the controller 126 shown in FIG. 1, and the DSD 1001 may implement the methods and functions described herein, such as in method 200, method 300, and method 400.

The DSD 1001 can optionally connect to be removable from a host device 1002, which can be a desktop computer, a laptop computer, a server, a telephone, a music player, another electronic device, or any combination thereof. The DSD 1001 can communicate with the host device 1002 via a hardware/firmware based host interface circuit 1004 that may include a connector (not shown) that allows the DSD 1001 to be physically removed from the host 1002.

The DSD 1001 can include a programmable controller 1006 with associated memory 1016 and processor 1012. The programmable controller 1006 may be part of a system on chip (SOC). A buffer 1014 can temporarily store user data during read and write operations and can include a command queue (CQ) 1015 where multiple access operations can be temporarily stored pending execution. Further, the DSD 1001 can include a read/write (R/W) channel 1018 which can encode data during write operations and reconstruct user data during read operations. The preamp 1008, which can be the preamp 102 of FIG. 1, can apply write currents to the head(s) 1018 and can provide preamplification of read back signals. A servo control circuit 1020 may use servo data from a servo sector to provide the appropriate current to the voice coil motor 1024 or a micro actuator to position the head(s) 1028 over disc(s) 1026. The controller 1006 can communicate with a processor 1022 to move the head(s)

1028 to the desired locations on the disc(s) 1026 during execution of various pending commands in the command queue 1015 or during other operations. The recording head 1028 can be configured to read and write data to a storage medium, for example disc 1026, having data storage tracks.

The controller 1006 (or the R/W channel 1018) can provide instructions to the preamp 1008 to sample one or more analog signals via control line 1011. The signals may come from the recording head 1028 or other source, such as laser (not shown). The signal samples may be digitized and stored to preamp 1008 registers logically assigned to the memory bank 1010. The registers in the memory bank 1010 may have been previously unassigned, or assigned to functions that may no longer be utilized or are not utilized at the time. The digitized signal samples may be stored to registers in the memory bank 1010 in a first-in-first-out configuration, or other configurations. The preamp 1008 may receive an indicator from the controller 1006 (or the R/W channel 1018) to perform delta compression, signal smoothing, or other operations on the digitized signal samples.

The controller 1006 (or the R/W channel 1018) may receive the digitized signal samples from the memory bank 1010. The controller 1006 (or the R/W channel 1018) can perform an analysis of digitized signal samples to determine what, if any, programmable settings of the preamp 1008 (or other circuits) may be changed based on the information provided from the sampled signals. In some cases, the digitized signal samples may be analyzed by a memory control circuit or other circuit in the preamp 1008. The memory control circuit or other circuit may be able to make decisions on sampled data to determine if there are any programmable settings within the preamp 1008 that can be changed, and then make the changes accordingly. For example, programmable settings can include an output power setting, an output current setting, an output timing setting, an amplification setting, a noise reduction setting, calibration settings, other settings, or any combination thereof.

In some embodiments the methods and circuits discussed herein can be utilized when a DSD is manufactured. For example, the preamp 1008 may acquire analog samples from test signals and store them to the memory bank 1010, which can then be used to adjust parameters of the preamp 1008, the head 1028, or other components during a manufacturing process.

Further, the methods and circuits discussed herein may be utilized while a DSD is in operation. For example, test signals from the head 1028 can be sampled, digitized, and stored to the memory bank 1010 for analysis during operation of the DSD to store and retrieve data for a host or other systems. For example, the controller 1006 (or the R/W channel 1018) may calibrate an output voltage of the head 1028 based on sampled data corresponding to laser power, or modify an amplification of a read signal based on sampled data corresponding to reader bias.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A circuit comprising:
   a preamplifier circuit including:
      a plurality of memory registers;
      a first input configured to receive an analog signal;
      an analog-to-digital converter (ADC) circuit configured to convert the analog signal into digital values;
      an interface configured to:
         receive one or more programmable settings from a controller circuit to selectively enable one or more registers of the plurality of memory registers to store the digital values;
         receive a control signal from the controller circuit to indicate a register should be repurposed from a first assigned purpose and instead be included in the one or more registers of the plurality of registers; and
      an output configured to provide the digital values to the controller circuit.

2. The circuit of claim 1 further comprising:
   the selectively enabled one or more registers configured as a first-in first-out buffer; and
   an ADC output register configured to store a digital value produced by the ADC circuit before the digital value is stored to the selectively enabled one or more registers.

3. The circuit of claim 1 further comprising:
   the preamplifier circuit including:
      a second analog-to-digital converter circuit configured to convert a second analog signal into a second set of digital values;
      a second set of memory registers to store the second set of digital values; and
      the preamplifier circuit configured to store the second set of digital values to the second set of memory registers.

4. The circuit of claim 1 further comprising the preamplifier circuit configured to acquire samples of the analog signal to produce signal samples, and convert the signal samples to the digital values upon detection of an indicator.

5. The circuit of claim 4 further comprising the indicator is one of a rising and falling edge of a clock signal.

6. The circuit of claim 4 further comprising the indicator causes the preamplifier circuit to acquire samples of the analog signal to produce signal samples, and convert the signal samples to the digital values until a stop acquire indicator is detected.

7. The circuit of claim 1 further comprising:
   the preamplifier circuit including:
      a signal selector circuit configured to allow selection of one of multiple analog signals available at the preamplifier circuit; and
      a control register programmable to indicate which of the multiple analog signals is selected for sampling.

8. A circuit comprising:
   preamplifier circuit including:
      a plurality of memory registers;
      a first input to receive an analog signal;
      a data converter circuit to convert the analog signal into digital values;
      a first interface configured to receive programmable settings from a controller circuit to selectively enable a subset of memory registers of the plurality of memory registers to store the digital values;
      a memory control circuit configured to:
         determine if a preamplifier caching mode is enabled;
         store the digital values to the subset of memory registers when the preamplifier caching mode is enabled;

not store the digital value to the subset of memory registers when the preamplifier caching mode is not enabled; and a second interface to provide the digital values to the controller circuit.

9. The circuit of claim 8 further comprising:

the preamplifier circuit including the memory control circuit configured to:

determine an average value corresponding to more than one digital value of the analog signal; and store the average value to the subset of memory registers.

10. The circuit of claim 8 further comprising:

the preamplifier circuit including:

a specific register that is not programmable to be selectively enabled and is configured to store a digital value produced by the data converter circuit before the digital value is stored to the subset of memory registers;

the memory control circuit configured to:

move the digital value from the specific register to a first register of the subset of memory registers when the preamplifier caching mode is enabled; and not move the digital value from the specific register to the first register, and overwrite the digital value with a new value when a next digital sample is acquired from the data converter circuit and the preamplifier caching mode is not enabled.

11. The circuit of claim 10 further comprising:

the preamplifier circuit including the memory control circuit configured to:

determine a difference value between the digital value stored in the specific register and a new digital value; and store the difference value to the subset of memory registers.

12. The circuit of claim 10 further comprising:

the preamplifier circuit including the memory control circuit configured to smooth the analog signal by averaging the digital value stored in the specific register with a previous digital value and a next digital value to determine an average value, and storing the average value to the subset of memory registers.

13. The circuit of claim 8 further comprising:

the preamplifier circuit including:

a control register configured to enable a burst read mode;

the memory control circuit configured to:

determine if the burst read mode is enable in the control register; and when the burst read mode is enabled, sequentially transmit, via the second interface, all digital values stored in the subset of memory registers to the controller circuit.

14. The circuit of claim 8 further comprising:

the controller circuit coupled to the preamplifier circuit via the first interface and the second interface, the controller circuit configured to:

selectively enable one or more registers to be included in the subset of registers;

selectively enable the preamplifier circuit to store data to the subset of registers; and select the analog signal from multiple available analog signals within the preamplifier circuit.

15. The circuit of claim 8 further comprising:

the preamplifier circuit includes a first input to receive a first analog signal, and a second input to receive a second analog signal;

the preamplifier circuit including the memory control circuit configured to:

upon receiving an indicator from the controller circuit, sample the first analog signal to produce a first analog sample, digitize the first analog sample to produce a first digital value, and store the first digital value to a register in the subset of memory registers; and without receiving another acquire indicator from the controller, sample the second analog signal to produce a second analog sample, digitize the second analog sample to produce a second digital value, and store the second digital value to another register in the subset of memory registers.

16. The circuit of claim 8 further comprising:

the preamplifier circuit coupled to a recording head in a data storage device, the recording head configured to read and write data to a storage medium having data storage tracks; and the preamplifier circuit configured to modify one or more settings of the data storage device based on the digital values.

17. The circuit of claim 8 further comprising:

the preamplifier circuit configured to acquire a sample of the analog signal based on a logical combination of multiple signals.

18. A method comprising:

selectively programming, within a preamplifier circuit, a set of memory registers of a plurality of memory registers to store a digital value corresponding to data converter samples;

acquiring, within the preamplifier circuit, a signal sample from an analog signal;

converting, within the preamplifier circuit, the signal sample to the digital value;

storing, within the preamplifier circuit, the digital value to the set of memory registers;

determining if another signal sample should be acquired;

storing the another signal sample to a specific register;

moving previous register contents to next register locations in the set of memory registers when the another signal sample should be acquired; and moving the another signal sample from the specific register to a first register in the set of memory registers; and providing the digital value at an output of the preamplifier circuit upon request.

19. The method of claim 18 further comprising:

receiving, at a control register of the preamplifier circuit, a first indicator of a selection of at least one analog signal to sample, the at least one analog signal corresponds to at least one of multiple signals available within the preamplifier circuit;

selecting the at least one analog signal to sample based on the first indicator;

receiving, at the control register of the preamplifier circuit, a second indicator of a combination operation; and performing the combination operation on the at least one analog signal based on the second indicator when the at least one analog signal includes multiple analog signals.

20. The method of claim 18 further comprising:

receiving, at the preamplifier circuit, a control signal to indicate a register should be repurposed from a first assigned purpose to be included in the set of memory registers.

21. The method of claim 18 further comprising:

determining, within the preamplifier circuit, whether oldest digital data should be erased from the set of memory registers; and erasing an oldest digital value from the set of memory registers when all of the set of memory registers contain a digital value.

22. The method of claim 18 further comprising:

determining if the set of memory registers all contain digital samples;

stop storing digital values to the set of memory registers when the set of memory registers all contain digital samples;

providing the digital values to a controller upon receiving a request from the controller; and erasing the set of memory registers based on programmable control bits programmable by the controller.

* * * * *